United States Patent [19]

Brown et al.

[11] Patent Number: 4,638,348
[45] Date of Patent: Jan. 20, 1987

[54] SEMICONDUCTOR CHIP CARRIER

[76] Inventors: David F. Brown, 22 Waterpump Court, Thorplands, Northampton; Michael J. Anstey, Penhallow, Kiln-Ride-Extension, Workingham, Berkshire, both of England

[21] Appl. No.: 595,454

[22] PCT Filed: Aug. 8, 1983

[86] PCT No.: PCT/GB83/00198

§ 371 Date: Mar. 30, 1984

§ 102(e) Date: Mar. 30, 1984

[87] PCT Pub. No.: WO84/00851

PCT Pub. Date: Mar. 1, 1984

[30] Foreign Application Priority Data

Aug. 10, 1982 [GB] United Kingdom ............... 8222947

[51] Int. Cl.⁴ ............................................ H01L 23/02
[52] U.S. Cl. .................................. 357/74; 357/80; 361/93
[58] Field of Search ..................... 357/74, 80, 75; 174/52 R, 52 FP, 52 S; 361/380, 404, 92, 93

[56] References Cited

U.S. PATENT DOCUMENTS

| 3,404,215 | 10/1968 | Burks | 357/74 |
| 3,614,541 | 10/1971 | Farrano | 361/394 |
| 4,320,438 | 3/1982 | Ibrahim | 174/52 FP |

FOREIGN PATENT DOCUMENTS

| 0021154 | 2/1980 | Japan | 357/74 B |
| 0124248 | 9/1980 | Japan | 357/74 C |
| 0115351 | 9/1980 | Japan | 357/74 |
| 0126948 | 10/1981 | Japan | 357/74 C |
| 1337791 | 11/1973 | United Kingdom . | |
| 1363805 | 8/1974 | United Kingdom . | |
| 2056772 | 3/1981 | United Kingdom | 357/74 C |
| 2095039 | 9/1982 | United Kingdom . | |
| 2094552 | 9/1982 | United Kingdom . | |

Primary Examiner—William D. Larkins
Assistant Examiner—Mark Prenty
Attorney, Agent, or Firm—Leydig, Voit & Mayer

[57] ABSTRACT

A circuit unit such as performing the function of a chip carrier. In one example, it is in the form of a thin square of insulating material having contact pads arranged side by side along the four edges of both major surfaces. The chip is secured substantially centrally of the insulating material and connections are made from it to the contacts on both of the major surfaces. The carrier has a lower insulating layer (5) having contacts (6) extending over its under surface and carrying the chip (14) on its upper surface. An insulating spacer (8) carries further contacts (12). Electrical connections (16 and 18) are made to the contacts (6 and 12). An insulating cover (not shown) then closes off the hollow interior, locating on a shoulder (10). The contacts (12) thus provide the contacts on the upper surface of the finished construction. A single layer construction is also disclosed. Double-sided chip carriers formed in this way are particularly suited for side-by-side mounting in racked manner, enabling maximum use to be made of the contacts on both of the major surfaces and facilitating flow of cooling air.

17 Claims, 17 Drawing Figures

SEMICONDUCTOR CHIP CARRIER

The invention relates to electrical circuit units.

Embodiments of the invention to be described in more detail below are in the form of so-called "chip carriers", that is circuit units incorporating integrated circuits ("chips"). Such embodiments of the invention may be used, for example, in circuit assemblies disclosed in co-pending U.K. Patent Application No. 8203852 (Ser. No. 2095039).

According to the invention, there is provided an electrical circuit unit, comprising electrically insulating material providing two side-by-side major surfaces each surface carrying a plurality of separate electrical contacts arranged adjacent to the edges of the surface, and electrical connections carried by the insulating material and connected to the contacts.

According to the invention, there is also provided a chip carrier, comprising flat electrically insulating material of rectangular external configuration defining upper and lower major surfaces, a plurality of separate electrical contacts arranged side by side along the four sides of each of the two major surfaces, a chip carried by the insulating material and completely enclosed, and electrical connections between the chip and the contacts.

Electrical circuit units embodying the invention will now be described by way of example only and with reference to the accompanying diagramatic drawings in which.

Figure 1:
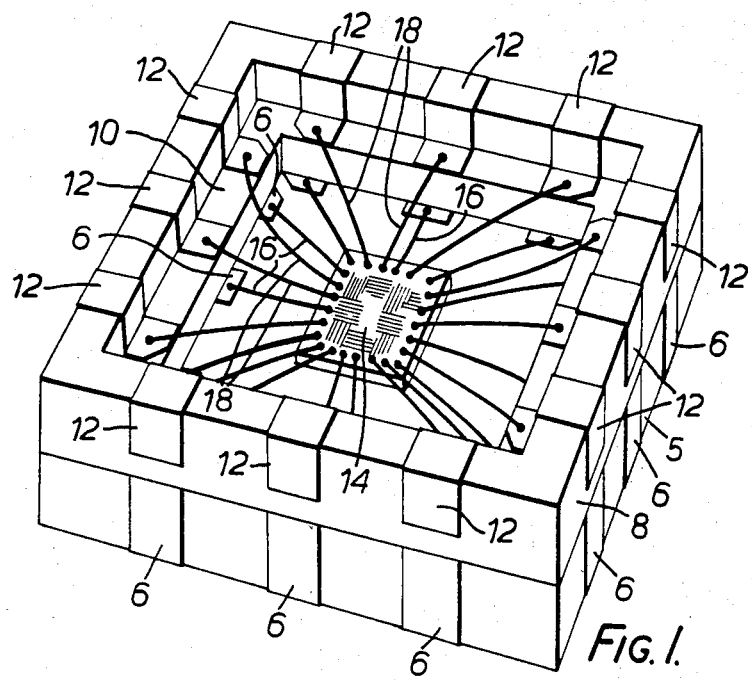
FIG. 1 is a perspective view of one of the circuit elements with a top insulating layer removed.
Figure 5:
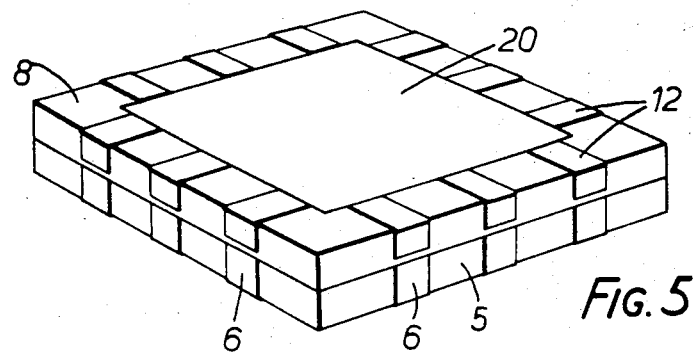
FIG. 5 is a perspective view of the unit of FIG. 1 with the top insulating layer in position.
Figure 7:
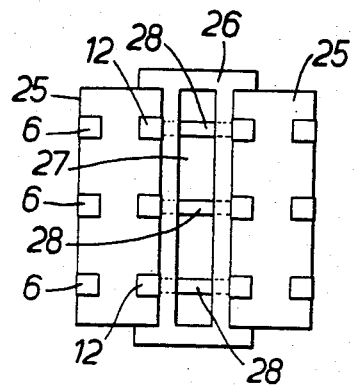
FIG. 7 is an end view of two of the circuit units connected by a spacer element.
Figure 8:
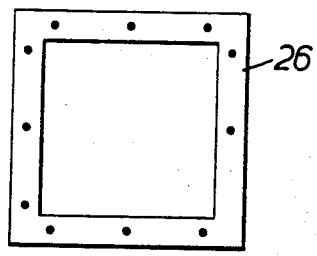
FIG. 8 is a side view of an alternative spacer element.
Figure 9:
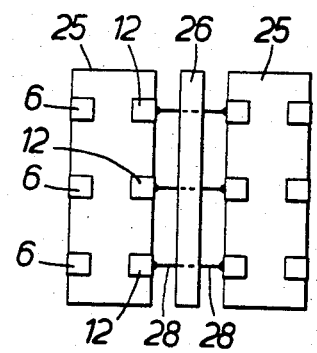
Figure 10:
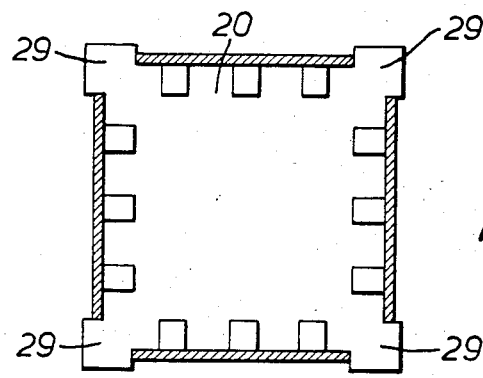
Figure 11:
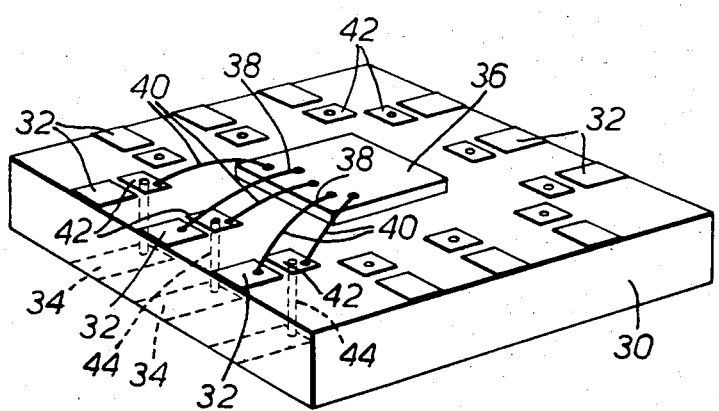
Figure 12:
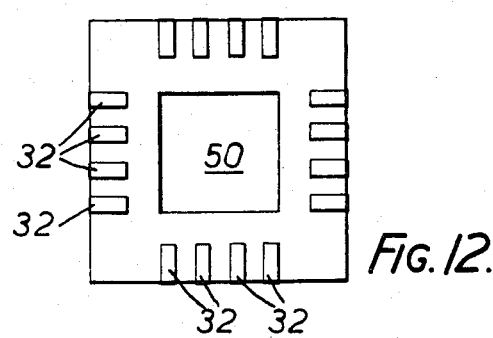
Figure 13:
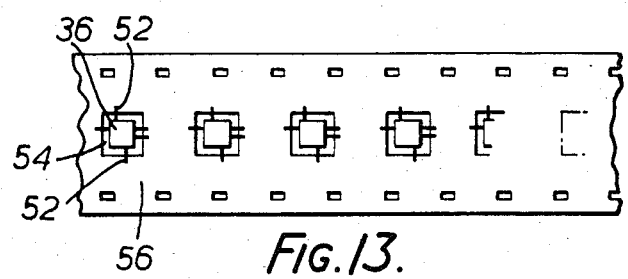

FIG. 9 corresponds to FIG. 7 but shows the spacer element of FIG. 8 in use;

FIG. 10 is a plan view corresponding to FIG. 5 but showing a modified form of the unit of FIG. 1;

FIG. 11 is a perspective view of another form of the circuit unit;

FIG. 12 is a plan view of a modified form of the circuit unit of FIG. 11;

FIG. 13 shows chips mounted on a tape in a tape-automated-bonding system; and

Figure 14:
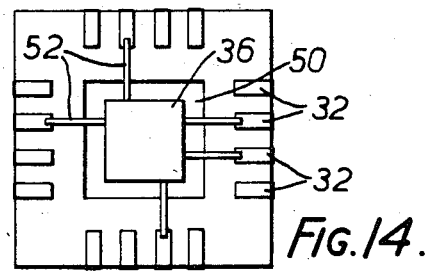
Figure 15:
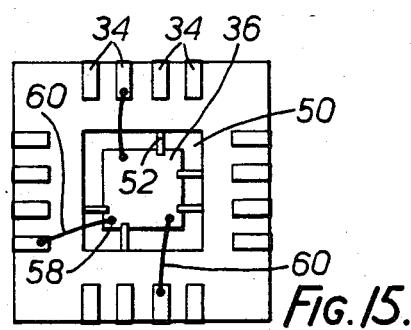

FIGS. 14 and 15 show stages in transferring chips from the tape shown in FIG. 13 to the chip carrier of FIG. 12.

Figure 2A:
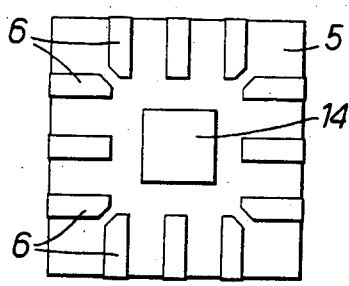
FIG. 2A is a plan view of a bottom insulating layer of the unit of FIG. 1.
Figure 3A:
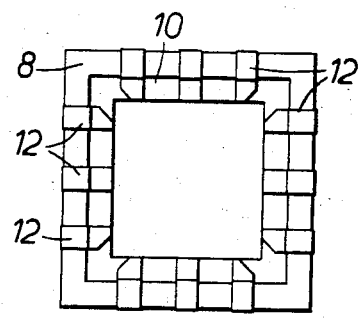
FIG. 3A is a plan view of an insulating spacer forming part of the unit of FIG. 1.
Figure 2B:
FIG. 2B is a side view of the layer of FIG. 2A.
Figure 3B:
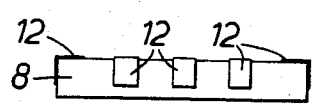
FIG. 3B is a side view of the spacer of FIG. 3B.

The unit comprises a base made of suitable insulating material such as glass fibre insulating material or ceramic material for example which may be square. Along each edge three (in this example) conductive pads or contacts 6 are provided. These are made of strip material such as plated on, and, as shown in FIGS. 1, 2A and 2B, each of them extends around an outside edge of the base so as to provide interconnected contact pads on the upper and lower surfaces of the base.

A spacer 8 of insulating material similar to that referred to above is placed on top of the base 5 and matches its outside dimension. As shown particularly in FIG. 1, the spacer has a shoulder 10 running around its inside. Along each of the four edges of the spacer 8 three contacts 12 are provided, each one of which extends on the outside surface of the spacer, over its top surface and terminates at the edge of the shoulder 10.

An electrical circuit device may be placed within the circuit unit as so far described.

In this particular example, the circuit device is an integrated circuit or chip 14 which is secured in a suitable manner to the upper surface of the base 5. Electrical connections such as shown at 16 and 18 are made from various points on the chip 14 to particular ones of the contacts 6 and 12. Such connections may be made by wire-bonding or other well-established connection techniques. The connections 16 are made to the contacts 6, that is, the contacts on the base 5, while the connections 18 are made to the contacts 12, that is, the contacts of the spacer 8.

Figure 4:
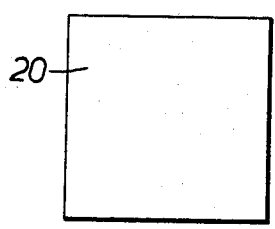
FIG. 4 is a plan view of the insulating top layer for the unit of FIG. 1 and which is omitted from FIG. 1.

The circuit unit is then completed by means of an insulating top layer 20 (FIG. 4), again such as made of the material described above for example, which is sized and shaped so as to fit within the recess provided by the shoulder 10 in the spacer 8. The top layer 20 thus seals the unit and protects the chip 14 and the internal connections 16 and 18, the layer 20 being secured in position by means of adhesive. FIG. 5 therefore shows the finished unit. It will be apparent that the finished unit provides a chip carrier having contact pads on both of its two major surfaces. As such, it is particularly suitable for incorporation as an element within a slotted holder such as a circuit assembly of the type disclosed in co-pending U.K. Patent Application No. 8203862 (Ser. No. 2095039). In such a circuit assembly, chip carriers such as disclosed in the present Specification may be mounted side-by-side in racked fashion, fitting into a mounting structure which both supports them and makes electrical contact to the contacts on both major surfaces of the chip carriers. There is thus very effective use of space and good cooling, among other advantages.

Figure 6:
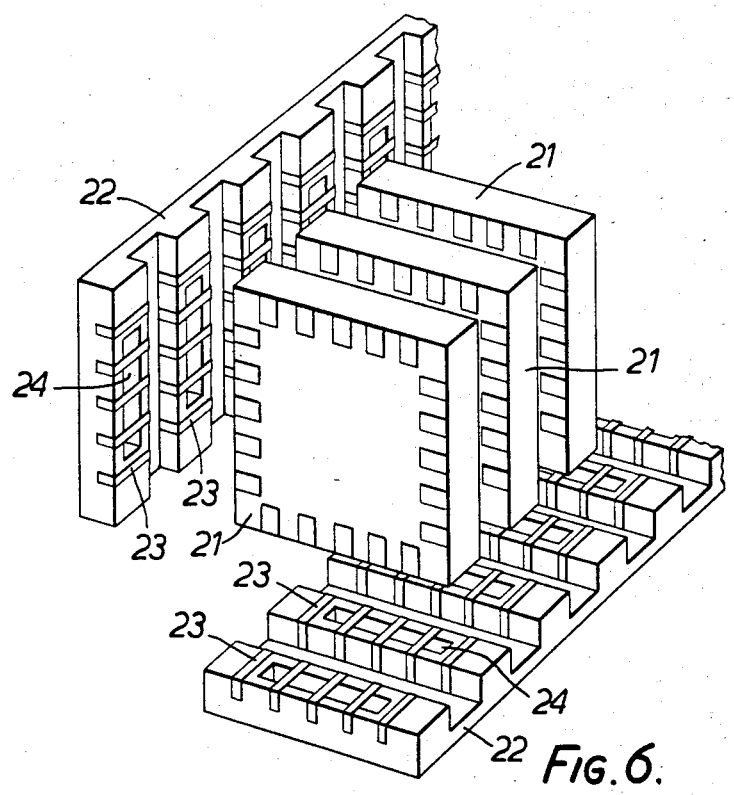
FIG. 6 is a perspective view showing one of the circuit units and, in exploded form, part of a racking assembly.

FIG. 6 shows chip carriers 21 as described above (but with five instead of three contacts along each side) mounted side by side and also shows two sides 22 of a racking assembly which has contacts 23 for making connections with the contacts 6 and 12. Each side 22 has a through aperture 24 to aid cooling. The other two sides of the racking assembly are omitted for clarity. In use all four sides would be clamped together to hold the chip carriers side by side and to make contact with them.

Instead, however, the chip carriers described could be used in conjunction with spacing elements placed between them, by means of which they would be electrically interconnected.

Such an arrangement is shown in FIG. 7 where two chip carriers are shown at 25, interconnected by a spacing element 26 made of suitable insulating material having a hollow centre aperture 27 across which connections 28 extend to make connections between the contacts on the chip carriers.

An alternative arrangement is shown in FIGS. 8 and 9. There the spacer element 26 is in the form of a hollow square frame through whose edges the connections 28 extend and are soldered to the contacts 6 and 12.

It will be apparent that the chip carrier described is advantageous in that the arrangement of the contacts on both of its opposite surfaces makes maximum use of the available space for external contacts as compared with chip carriers which are designed to be mounted in a 2-dimensional manner, that is, flat on a circuit board and which therefore can only have contacts on one of the two major surfaces. The chip carriers described and illustrated herein can therefore be made of reduced size in proportion to the number of contacts.

FIG. 10 shows a variation in which the base 5 and the spacer 8 (FIG. 1) are arranged to provide lugs 29 at the corners of the finished circuit unit to facilitate correct location and alignment of the circuit unit and its contacts 6 and 12 when used in a rack arrangement or similar.

The spacer 8 could be made of resilient insulating material which would thus help to provide increased contact pressure for the contacts 6 and 12 when the unit is inserted in a suitable slotted holder. Advantageously the contacts 6 and 12 are arranged to stand slightly proud from the upper and lower surfaces of the circuit unit.

Cooling may be improved by arranging for the material of the base 5 and/or the spacer 8 and/or the top layer 20 to be made of heat dissipating material.

It will be appreciated that the circuit unit described is not restricted to use as a chip carrier. Any suitable circuit device may be incorporated within the unit instead of an integrated circuit chip, and electrical connections made to the contacts in the manner shown. For example, the circuit device incorporated could be a rechargeable or nonrechargeable cell or battery. Instead, however, there may be no actual circuit device within the unit. There could for example simply be an arrangement for interconnecting various ones of the contacts 6 and 12 together by means of electrical connections which, when the top layer 20 is in place, would be sealed-in and protected. Such a circuit unit would then provide an interconnection unit for making predetermined crossover connections. Thus, in a racking arrangement in which a plurality of circuit units as described were arranged side-by-side in racked manner in an assembly arranged to make electrical connections to the contacts 6 and 12 (such as an assembly described in the above-mentioned co-pending U.K. Patent Application) one of the racked units could be an interconnection unit as just described, and if the other units on either side of it were carrying chips, for example, the interconnection unit would provide a predetermined pattern of interconnections which, via the contacts 6 and 12 of all three units, would make the required interconnections between different parts of the chips in the adjacent chip carriers.

FIG. 11 shows another one of the circuit units which differs from the unit of FIG. 1 in that it is made of a single layer, 30, of insulating material instead of the three layers 5,8 and 20 of the unit of FIG. 1. As shown in FIG. 11, the single layer 30 of insulating material (which may be of the material described above for example) has contact pads 32 plated to its upper surface along its four sides and contacts 34 similarly plated to its under surface. On the upper surface, a circuit element 36, which may again be an integrated circuit or chip (but could be any other suitable form of circuit device) is placed and bonded to the layer 30 in a suitable manner. If desired, the circuit device 36 could be placed within a suitably shaped recess.

Connections 38 connect various parts of the circuit device 36 to the upper contacts 32, such as by a wire bonding process of normal form.

Connections 40 similarly connect the circuit device 36 to the lower contacts 34. The connections 40 are made to intermediate contact pads 42 on the upper surface of the layer 30, these being in turn connected to respective ones of the contacts 34 via plated-through holes 44. However, other means of making connections through the layer 30 to the contacts 34 could be used instead.

After the connections have been made, the circuit device 36 may be encapsulated in any suitable way by applying an encapsulant over it.

The single layer form showing in FIG. 11 is particularly suited for use with tape-automated bonding systems.

FIGS. 12 to 14 show a modified form of the circuit of FIG. 11 and illustrate how a circuit device may then be placed in position thereon by means of a tape-automated-bonding system.

FIG. 12 illustrates the circuit unit which is similar to that shown in FIG. 11 except that it does not have the contact pads 42 and the plated-through holes 44, and has its centre removed to provide an opening 50. The contacts 34 are of course not visible in FIG. 8.

FIG. 13 shows a series of chips 36 mounted on leads 52 in openings 54 in a tape 56 in the normal tape-automated-bonding manner.

In the usual way, the tape 56 is indexed over the chip carrier and when one of the chips 36 carried by the tape 56 is positioned over the opening 50 (FIG. 12), the chip is removed from of the tape 56 and on to the chip carrier as shown in FIG. 14, the leads 52 becoming bonded to appropriate ones of the contacts 32 to make the required electrical connections.

FIG. 15 shows the reverse side of the chip carrier with bonding pads 58 on the underside of the chip 36. By means of these pads, the chip is electrically connected to appropriate ones of the contacts 34 by wire connections 60.

The chip is then encapsulated in a suitable encapsulant material.

The arrangement described in FIGS. 12 to 15 is advantageous in that it provides even better cooling.

It may be advantageous to make the insulating material 30 in multilayer form with conductive layers between the insulating layers to provide a capacitive effect, the conductive layers being suitably electrically connected to particular ones of the contacts 6, 12.

The circuit units may be of any suitable size and can ha any suitable number of contacts. For example a circuit unit of square configuration and having sides of 37 millimeters (one and half inches) could have ten or eleven contacts per edge at a pitch of 2.5 millimeters (0.1 inches) or twice that number of contacts at half the pitch. Although the circuit units are of square configuration, this is not essential. They could be of any other suitable configuration.

We claim:

1. A chip carrier comprising:
   a body of flat electrically insulating material of rectangular external configuration defining upper and lower major surfaces;
   a first plurality of electrical contacts arranged side-by-side along the four sides of the upper surface and a second plurality of electrical contacts arranged side-by-side along the four sides of the lower surface, the contacts of the first plurality being separate from the contacts of the second plurality;
a single chip mounted on the insulating material and completely enclosed; and
electrical connections between the chip and the contacts,
the body of insulating material being a single square slab of insulating material having the chip mounted on the upper surface, the chip being enclosed by encapsulation.

2. A chip carrier according to claim 1, characterised in that the chip is connected to the contacts on the lower surface of the slab by means of plated-through holes extending through the slab.

3. A chip carrier according to claim 1, characterised in that the slab of insulating material has an opening through it of greater size than the chip, the chip being mounted within the opening and supported therein by means of at least some of the said connections.

4. A chip carrier comprising:
a body of flat electrically insulating material of rectangular external configuration defining upper and lower major surfaces;
a first plurality of electrical contacts arranged side-by-side along the four sides of the upper surface and a second plurality of electrical contacts arranged side-by-side along the four sides of the lower surface, the contacts of the first plurality being separate from the contacts of the second plurality;
a single chip mounted on the insulating material and completely enclosed; and
electrical connections between the chip and the contacts,
the body of insulating material including a square unitary base slab of insulating material having opposed major surfaces one of which defines the lower surface and the other of which defines an intermediate surface, and having the second plurality of the contacts arranged along the four edges of the lower surface but each having an extension onto the intermediate surface, a square hollow frame-shaped spacer of insulating material matching the size of the base slab and defining frame-shaped top and under faces and having the first plurality of the contacts arranged on its top face, the spacer being mounted with its under face on the intermediate surface of the base slab so as to define an enclosure with that intermediate surface and in which enclosure the chip is mounted, the spacer being sized so that the extensions of the contacts on the base slab extend into the enclosure, and the contacts on the top face of the spacer extending into the enclosure but being spaced from the extensions of the contacts of the second plurality, the electrical connections being made within the enclosure to the extensions and to the first plurality of the contacts where they extend into the enclosure, and a top layer of insulating material closing off the enclosure but not covering the contacts on the top face of the spacer.

5. A chip carrier according to claim 4, characterised in that the top face of the spacer provides a shoulder running around the inside of the spacer on which shoulder is located the top layer.

6. A chip carrier comprising:
a body of flat electrically insulating material of rectangular external configuration defining upper and lower major surfaces;
a first plurality of electrical contacts arranged side-by-side along the four sides of the upper surface and a second plurality of electrical contacts arranged side-by-side along the four sides of the lower surface, the contacts of the first plurality being separate from the contacts of the second plurality;
a single chip mounted on the insulating material and completely enclosed; and
electrical connections between the chip and the contacts,
said chip carrier in combination with at least one other similar said chip carrier, the chip carriers being arranged side-by-side with each major surface of each chip carrier being parallel to and facing one of the major surfaces of the adjacent chip carrier, the chip carriers being spaced from each other by spacing means which makes electrical contact with the contacts.

7. A chip carrier according to claim 6, characterised in that the spacing means comprises at least one continuous member made of insulating material which has a plurality of side-by-side slots which each receive, support and locate an edge of a respective one of the chip carriers, the slots incuding electrically conductive areas for connecting to the contacts on the chip carriers.

8. A chip carrier according to claim 7, characterised in that there are four such continuous members each of whose slots receives, supports and locates a respective one of the four edges of a respective one of the chip carriers.

9. A chip carrier according to claim 6, characterised in that the spacing means comprises a plurality of individual spacers each placed between a respective pair of the chip carriers.

10. An electric circuit assembly, comprising
a plurality of individual chip carriers each of which is in the form of a body of electrically insulating material defining and separating first and second opposed major surfaces each carrying a respective plurality of electrical contacts arranged adjacent to its periphery with the contacts of one plurality being separated from those of the other plurality, and having a single chip carried by the insulating material and electrically connected to contacts of both said pluralities, and
mounting means mounting the chip carriers in stacked configuration so that one of the said major surfaces on one carrier faces but is separated from a respective one of the major surfaces on each adjacent carrier, the mounting means including a plurality of spacing elements each of which is placed between the said facing major surfaces of a respective pair of adjacent chip carriers, each said spacing element comprising electrically insulating material supporting a plurality of electrical contacts configured so as to connect to respective ones of the said contacts on the chip carriers.

11. An assembly according to claim 10, in which each spacing element defines a gap of predetermined size extending between the said facing major surfaces of the respective pair of adjacent chip carriers, and including electrical connections extending across the gap and connection respective ones of the contcts supported on the spacing element.

12. An assembly according to claim 10, in which each spacing element has electrical connections extending through it and connecting respective ones of the contacts which it supports.

13. An assembly according to claim 10, in which each spacing element is in the form of a frame-shaped member matching the peripheral shape of each chip carrier.

14. An assembly according to claim 13, in which each chip carrier is of rectangular configuration with the electrically insulating material being in the form of a unitary slab defining the opposed major surfaces.

15. An assembly according to claim 14, in which each chip is mounted on one of the said surfaces of the respective slab and connected to the contacts on the other said surface thereof by means of plated-through holes extending through the slab.

16. An assembly according to claim 14, in which each slab has an opening through it of greater size than the respective chip, the chip being mounted within the opening, and including electrical connections which connect the chip to the said contacts on the slab and which also physically support the chip within the opening.

17. An assembly according to claim 13, in which the insulating material of each chip carrier is in the form of a square unitary base slab one of whose major surfaces defines the said first major surface and the other of which defines an intermediate surface, and having one said plurality of the contacts arranged along the four edges of the said first surface but each such contact having an extension onto the said intermediate surface, a square hollow frame-shaped spacer of insulating material matching the size of the base slab and defining frame-shaped top and under faces and having the other said plurality of contacts arranged along its top face, the spacer being mounted with its said under face on the said intermediate surface of the base slab so as to define an enclosure with that intermediate surface and in which enclosure the said chip is mounted, the spacer being sized so that the said extensions of the contacts on the base slab extend into the enclosure, and the contacts on the top face of the spacer extending into the enclosure but being spaced from the said extensions of the contacts of the other plurality, and a top layer of insulating material closing off the enclosure but not covering the contacts on the top face of the spacer, the top layer together with the top face of the spacer defining the said second major surface.

* * * * *